United States Patent
Yamawaku et al.

(10) Patent No.: US 8,593,780 B2
(45) Date of Patent: Nov. 26, 2013

(54) SUBSTRATE REMOVING METHOD AND STORAGE MEDIUM

(75) Inventors: Jun Yamawaku, Nirasaki (JP); Yohei Yamazawa, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/434,281

(22) Filed: Mar. 29, 2012

(65) Prior Publication Data

US 2012/0250214 A1  Oct. 4, 2012

Related U.S. Application Data (60) Provisional application No. 61/477,644, filed on Apr. 21, 2011.

(30) Foreign Application Priority Data

Mar. 30, 2011 (JP) .................... 2011-076319

(51) Int. Cl.
*H01L 21/683* (2006.01)
*H01T 23/00* (2006.01)

(52) U.S. Cl.
USPC ......................................... 361/234

(58) Field of Classification Search
None
See application file for complete search history.

(56) References Cited

U.S. PATENT DOCUMENTS 6,373,681 B2 *  4/2002  Kanno et al. ............... 361/234
7,335,315 B2 *  2/2008  Matsuda et al. ............ 216/60

FOREIGN PATENT DOCUMENTS

| | | |
|---|---|---|
| JP | 04-230051 | 8/1992 |
| JP | 05-226291 | 9/1993 |
| JP | 09-213780 | 8/1997 |

* cited by examiner

*Primary Examiner* — Dharti Patel
(74) *Attorney, Agent, or Firm* — Cantor Colburn LLP

(57) ABSTRACT

A substrate processing apparatus includes an electrostatic chuck enclosing an electrostatic electrode plate and a chamber having a ground potential and housing the electrostatic chuck. When the absolute value of the potential generated at a wafer after DC discharge is generated between the wafer and the chamber is 0.5 kV, the potential of the electrostatic electrode plate is changed from 2.5 kV to 1.5 kV to generate DC discharge so that the absolute value of the potential of a placing surface of the wafer of the electrostatic chuck becomes 0.5 kV after the plasma etching process, the polarities of the potential of the placing surface after the change and the wafer become the same, and the absolute value of the potential difference between the wafer and the chamber becomes 0.5 kV or more. The wafer is then removed from the electrostatic chuck.

5 Claims, 5 Drawing Sheets

SUBSTRATE REMOVING METHOD AND STORAGE MEDIUM

CROSS-REFERENCE TO RELATED APPLICATIONS

This application is based on and claims priority from Japanese Patent Application No. 2011-076319, filed on Mar. 30, 2011, with the Japanese Patent Office, the disclosure of which is incorporated herein in its entirety by reference. Also, this application claims the benefit of U.S. Provisional Application No. 61/477,644 filed on Apr. 21, 2011, with the United States Patent and Trademark Office, which is herein incorporated by reference in its entirety.

TECHNICAL FIELD

The present disclosure relates to a substrate removing method of removing a substrate electrostatically adsorbed at an electrostatic chuck and a computer-readable storage medium storing a program that, when executed, causes a computer to perform the substrate removing method.

BACKGROUND

A wafer for a semiconductor device as a substrate (hereinafter, a "wafer") is processed with a predetermined process such as, for example, a plasma process in a depressurized processing chamber of a substrate processing apparatus. The wafer is electrostatically adsorbed by an electrostatic chuck disposed in the processing chamber so as not to deviate from a desired position during the predetermined process.

The electrostatic chuck is a planar member made of a high-resistance dielectric material such as, for example, ceramics having an electrostatic electrode plate therein, and the wafer is placed on the upper surface of the electrostatic chuck. When a DC power source is connected to the electrostatic electrode plate to supply a positive DC voltage, a negative potential is generated on the surface of the electrostatic chuck side (hereinafter, a "rear surface") of the placed wafer, and thus a potential difference is generated between the electrostatic electrode plate and the rear surface of the wafer. However, since the dielectric material of the electrostatic chuck presents between the electrostatic electrode plate and the wafer, electric charges do not move between the electrostatic electrode plate and the wafer, and thus, the potential difference is maintained therebetween. As a result, the wafer is electrostatically adsorbed at the electrostatic chuck by an electrostatic force caused by the potential difference.

An upper electrode plate with a ground potential is disposed so as to face the electrostatic chuck in the processing chamber of the substrate processing apparatus. Since there exists plasma 51 always between a wafer W and an upper electrode plate 50 when a plasma process is performed for wafer W in the substrate processing apparatus, as shown in FIG. 5A, the electric charges between wafer W and upper electrode plate 50 freely move by the electrons or the cations in plasma 51. As a result, even though the potential of an electrostatic electrode plate 52 (represented by "HV" in the drawings) in an electrostatic chuck 53 is set to, for example, 2.5 kV, the potential of wafer W (represented by "Wafer" in the drawings) becomes the same ground potential as the potential of upper electrode plate 50 (represented by "UEL" in the drawings), that is, 0 V.

Figure 5:
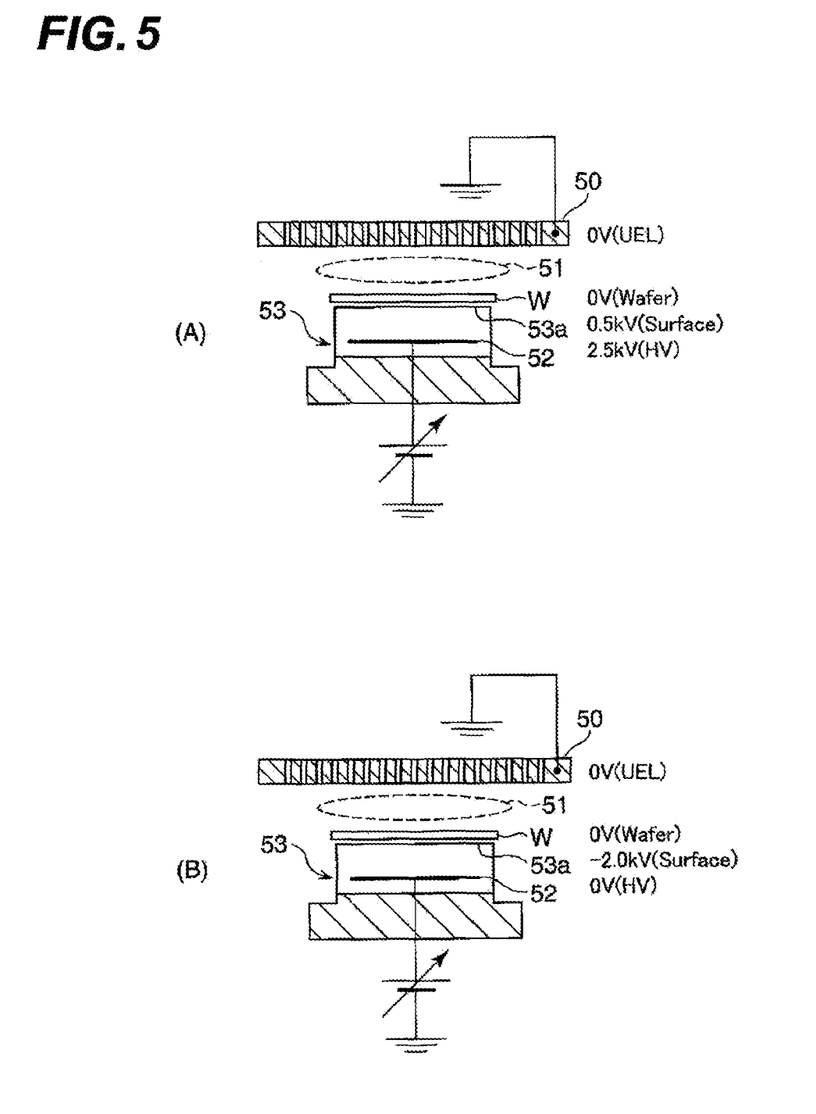
FIG. 5 is a view for describing a substrate removing method in the related art.

Meanwhile, since the dielectric material of electrostatic chuck 53 has a high resistance, ideally, the electric charges do not move between a wafer placing surface 53a which is the surface of electrostatic chuck 53 and electrostatic electrode plate 52. However, some of the electric charges may move by, for example, a continuous usage at a high temperature or a process condition. However, since the dielectric material of electrostatic chuck 53 still has a high resistance, the movement of the electric charges between wafer placing surface 53a and electrostatic electrode plate 52 is suppressed, and thus, only a few of the electric charges move. Moreover, the moving speed of the electric charges is very slow and the electric charges hardly move after the few electric charges have moved. As a result, the potential difference may be maintained between electrostatic electrode plate 52 and wafer placing surface 53a. Accordingly, when the potential of electrostatic electrode plate 52 and the potential of wafer placing surface 53a (represented by "Surface" in the drawings) are the ground potential (0 V) when, for example, wafer W is placed on electrostatic chuck 53, for example, when a DC voltage having a potential of 2.5 kV is applied to electrostatic electrode plate 52 to change the potential of electrostatic electrode plate 52 into 2.5 kV, the potential of wafer placing surface 53a is also changed from 0 V to, for example, 0.5 kV, but no more. As a result, an absolute value of the potential difference between electrostatic electrode plate 52 and wafer placing surface 53a is maintained at 2.0 kV.

However, in order to easily remove wafer W from electrostatic chuck 53 after the plasma process, for example, it has been proposed recently that voltage having an opposite polarity to the applied voltage during the plasma process is applied to electrostatic electrode plate 52 (see, for example, Japanese Patent Application Laid-Open No. H04-230051) or that the potential of electrostatic electrode plate 52 is changed to 0 V.

SUMMARY

An exemplary embodiment of the present disclosure provides a substrate removing method. The substrate removing method includes: providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck and a plasma process is performed on the substrate; maintaining a potential of the electrostatic electrode plate after the plasma process at the same predetermined potential as the potential of the electrostatic electrode plate during the plasma process; when an absolute value of a potential generated at the substrate is |A| after the DC discharge is generated between the substrate and the chamber, changing the potential of the electrostatic electrode plate from the predetermined potential to generate a DC discharge so that the absolute value of the potential of a placing surface of the electrostatic chuck on which the substrate is placed becomes |A|, the polarity of the potential of the placing surface after the change and the polarity of the potential of the substrate become the same as each other, and the absolute value of the potential difference between the substrate and the chamber becomes |A| or more; and removing the substrate from the electrostatic chuck.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

When the potential of electrostatic electrode plate 52 is changed from 2.5 kV to 0 V while maintaining plasma 51, since the potential of wafer W remains at 0 V and the potential of electrostatic electrode plate 52 also becomes 0 V, the potential difference between wafer W and electrostatic electrode plate 52 is resolved. However, the absolute value of the potential difference between electrostatic electrode plate 52 and wafer placing surface 53a is maintained to be 2.0 kV, and thus, the potential of wafer placing surface 53a is changed from 0.5 kV to −2.0 kV. Accordingly, since the potential difference between wafer W and wafer placing surface 53a is not resolved, and wafer W is electrostatically adsorbed at electrostatic chuck 53 by the electrostatic force according to the potential difference between wafer W and wafer placing surface 53a. Therefore, there is a problem in that wafer W may not be easily removed from electrostatic chuck 53.

Even in a case where the potential of electrostatic electrode plate 52 is changed from 2.5 kV to 0 V after turning OFF plasma 51, since the potential of wafer W still remains at 0 V and the potential of electrostatic electrode plate 52 also becomes 0 V, the absolute value of the potential difference (2.0 kV) is maintained between electrostatic electrode plate 52 and wafer placing surface 53a.

The present disclosure has been made in an effort to provide a substrate removing method capable of easily removing a substrate from an electrostatic chuck and a storage medium storing the method.

An exemplary embodiment of the present disclosure provides a substrate removing method. The substrate removing method includes: providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate; maintaining a potential of the electrostatic electrode plate after the plasma process at a same predetermined potential as the potential of the electrostatic electrode plate during the plasma process; when an absolute value of a potential generated at the substrate is |A| after the DC discharge is generated between the substrate and the chamber; changing the potential of the electrostatic electrode plate from the predetermined potential to generate a DC discharge so that the absolute value of the potential of a placing surface of the electrostatic chuck on which the substrate is placed becomes |A|, the polarity of the potential of the placing surface after the change and the polarity of the potential of the substrate become the same as each other, and the absolute value of the potential difference between the substrate and the chamber becomes |A| or more; and removing the substrate from the electrostatic chuck.

The substrate removing method may further include, after the removing process, generating plasma between the chamber and the electrostatic chuck at the same time when the potential of the electrostatic electrode plate is changed into a ground potential.

Another exemplary embodiment of the present disclosure provides a computer-readable storage medium storing a program that, when executed, causes a computer to perform a substrate removing method. The substrate removing method includes: providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck and a plasma process is performed on the substrate; maintaining a potential of the electrostatic electrode plate after the plasma process at the same predetermined potential as the potential of the electrostatic electrode plate during the plasma process; when an absolute value of a potential generated at the substrate is |A| after the DC discharge is generated between the substrate and the chamber; changing the potential of the electrostatic electrode plate from the predetermined potential to generate a DC discharge so that the absolute value of the potential of a placing surface of the electrostatic chuck on which the substrate is placed becomes |A|, the polarity of the potential of the placing surface after the change and the polarity of the potential of the substrate become the same as each other, and the absolute value of the potential difference between the substrate and the chamber becomes |A| or more; and removing the substrate from the electrostatic chuck.

According to the exemplary embodiments of the present disclosure, since the absolute value of the potential difference between the substrate and the chamber becomes |A| or more which is a minimum value of the potential difference by which the DC discharge can be generated and which is the absolute value of the potential generated at the substrate after the DC discharge is generated between the substrate and the chamber, the absolute value of the potential generated at the substrate after the DC discharge is generated between the substrate and the chamber becomes |A|. The polarity of the potential of the placing surface of the electrostatic chuck and the polarity of the potential of the substrate are the same as each other, and the absolute value of the potential of the placing surface is |A|. Accordingly, the potential of the substrate and the potential of the placing surface of the electrostatic chuck may be the same potential as each other. As a result, the substrate is not electrostatically adsorbed at the electrostatic chuck and may be easily removed from the electrostatic chuck.

Hereinafter, exemplary embodiments of the present disclosure will be described with reference to accompanying drawings.

Figure 1:
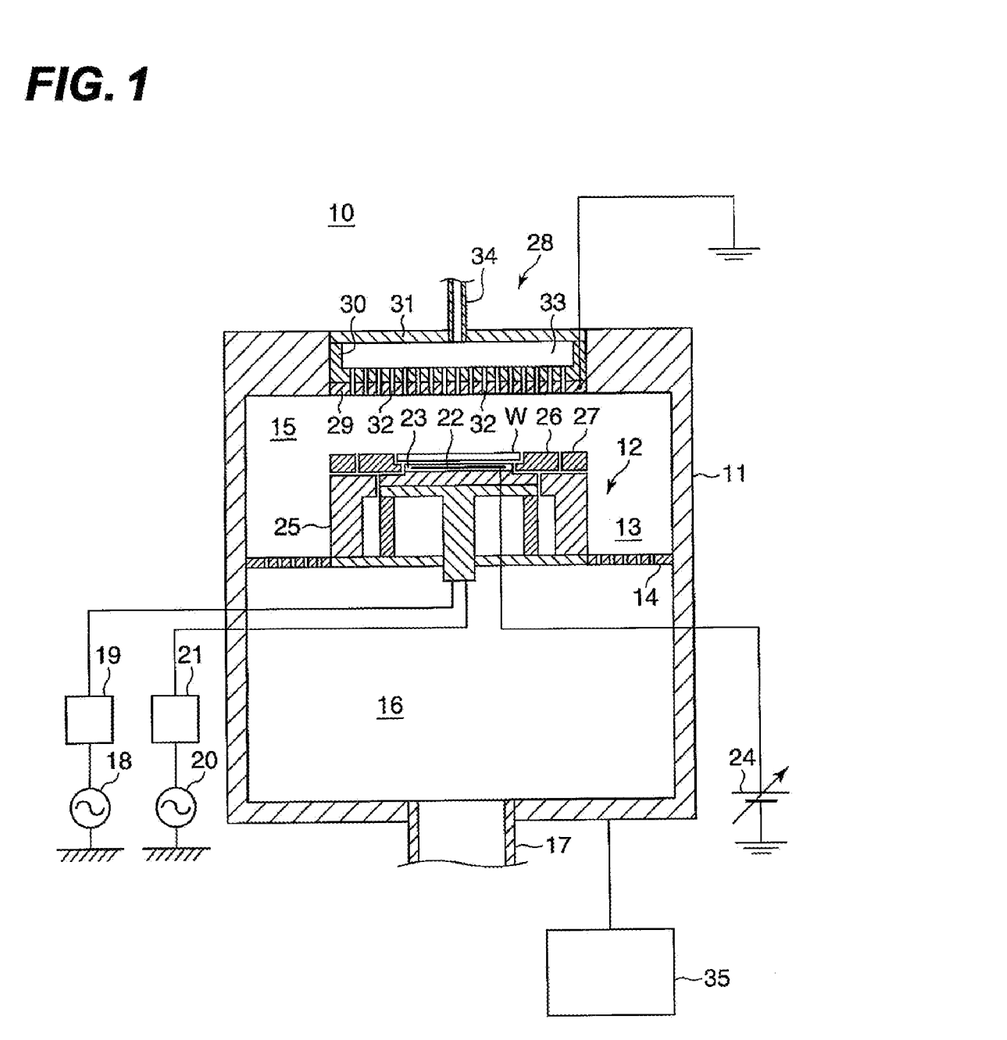
FIG. 1 is a schematic view illustrating the configuration of a substrate processing apparatus in which a substrate removing method according to an exemplary embodiment of the present disclosure is performed.

FIG. 1 is a schematic view illustrating the configuration of a substrate processing apparatus in which a substrate removing method is performed according to an exemplary embodiment of the present disclosure. A wafer for a semiconductor device as a substrate is processed with a predetermined process such as, for example, a plasma process in a depressurized processing chamber of a substrate processing apparatus.

In FIG. 1, a substrate processing apparatus 10 includes a chamber 11 having a ground potential and housing a wafer W having a diameter of, for example, 300 mm, and a cylindrical susceptor 12 where wafer W is placed on the upper surface thereof is disposed in chamber 11. In substrate processing apparatus 10, a side exhaust line 13 is formed by the inside wall of chamber 11 and the side surface of susceptor 12. An exhaust plate 14 is disposed in the middle of side exhaust line 13.

Exhaust plate 14 is a planar member having a plurality of through-holes and serves as a diaphragm dividing the inside of chamber 11 into an upper portion and a lower portion. Plasma is generated at the inner space of an upper portion 15 (a "processing chamber") inside chamber 11 divided by exhaust plate 14, as described below. An exhaust pipe 17 discharging gas in chamber 11 is connected to a lower portion 16 (an "exhaust chamber (manifold)") inside chamber 11. Exhaust plate 14 captures and reflects the plasma generated in processing chamber 15 to prevent the plasma from being leaked to manifold 16.

A turbo molecular pump (TMP) and a dry pump (DP) (both not shown) are connected to exhaust pipe 17 and these pumps vacuum-suck the inside of chamber 11 to depressurize the inside of chamber 11. Specifically, the DP depressurizes the inside of chamber 11 up to a middle vacuum state from atmospheric pressure and the TMP, in cooperation with the DP, depressurizes the inside of chamber 11 up to a high vacuum state of pressure lower than the middle vacuum state. The pressure in chamber 11 is controlled by an APC valve (not shown).

A first high frequency power source 18 is connected to susceptor 12 in chamber 11 through a first matching device 19 and supplies a high frequency power to susceptor 12 for an ion injection of a relatively low frequency, for example, 2 MHz. A second high frequency power source 20 is connected to susceptor 12 through a second matching device 21 and supplies a high frequency power to susceptor 12 for plasma generation of a relatively high frequency, for example, 40 MHz. Susceptor 12 to which two kinds of high frequency powers are supplied functions as a lower electrode.

A step is formed at the upper periphery of susceptor 12 so that the center of susceptor 12 protrudes toward the upper side of the drawing. Disk shaped electrostatic chuck 23 made of a dielectric material such as, for example, ceramics having electrostatic electrode plate 22 therein, is disposed at the front end of the center of susceptor 12. When a DC power source 24 is connected to electrostatic electrode plate 22 and positive DC voltage is applied to electrostatic electrode plate 22, a negative potential is generated on the surface of electrostatic chuck 23 side of wafer W (a "rear surface"), and thus, a potential difference is generated between electrostatic electrode plate 22 and the rear surface of wafer W. At this time, as described below, a potential difference is also generated between wafer W and placing surface 23a of electrostatic chuck 23. The potential difference between wafer W and placing surface 23a generates the Coulomb force which is the electrostatic force, and thus, wafer W is adsorbed and held at electrostatic chuck 23 by the Coulomb force.

Susceptor 12 includes a cooling mechanism (not shown) having a coolant flow channel therein and the cooling mechanism absorbs the heat of wafer W where temperature is increased by contacting with plasma thereby preventing the temperature of wafer W from being increased to a desired temperature or more.

Susceptor 12 is constituted with a conductor such as, for example, aluminum in consideration of thermal conductivity efficiency or an electrode function. In order to prevent the conductor from being exposed in processing chamber 15 by which the plasma is generated, the side of susceptor 12 is covered with a side protective member 25 made of a dielectric material such as, for example, quartz ($SiO_2$).

Above susceptor 12, an annular focus ring 26 is disposed at the step of susceptor 12 or side protective member 25 so as to surround wafer W adsorbed and held at electrostatic chuck 23, and a shield ring 27 is disposed at side protective member 25 so as to surround focus ring 26. Focus ring 26 is made of silicon (Si) or silicon carbide (SiC) and a distribution area of the plasma is expanded above wafer W and focus ring 26.

A shower head 28 is disposed at the ceiling part of chamber 11 so as to face susceptor 12. Shower head 28 includes a disk-shaped upper electrode plate 29, a cooling plate 30 detachably suspending and holding upper electrode plate 29, and a cover 31 covering cooling plate 30. Disk-shaped upper electrode plate is made of a conductor of which the surface is covered with an insulating film or a single semiconductor such as, for example, silicon. Since upper electrode plate 29 is formed by a disk-shaped member having a plurality of gas holes 32 passing therethrough in a thickness direction and electrically grounded, the potential of upper electrode plate 29 is a ground potential. A buffer chamber 33 is provided in cooling plate 30 and a processing gas introducing pipe 34 is connected to buffer chamber 33.

Substrate processing apparatus 10 further includes a controller 35 that controls the operation of each element to perform a plasma etching process according to a program stored in, for example, a built-in memory. Specifically, controller 35 controls the operation of each element to introduce the processing gas supplied to buffer chamber 33 through processing gas introducing pipe 34 into the inner space of processing chamber 15 and excite the introduced processing gas with high frequency power applied from second high frequency power source 20 to the inner space of processing chamber 15 through susceptor 12 to generate plasma. Controller 35 performs the plasma etching process onto wafer W by injecting cations in the plasma toward wafer W by the high frequency power for ion injection applied from first high frequency power source 18 to susceptor 12 or by making the radicals in the plasma to reach wafer W.

Figure 2:
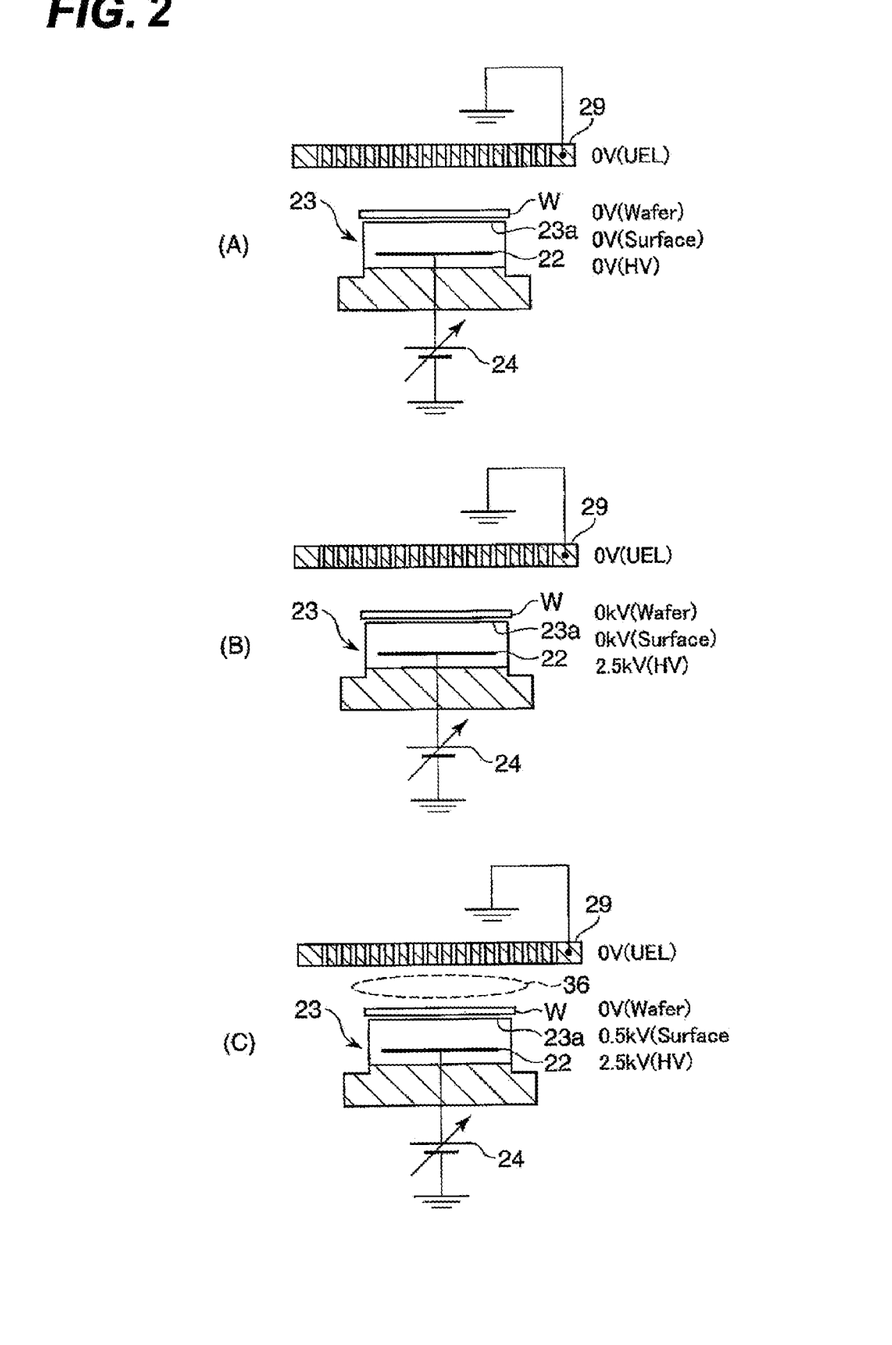
FIG. 2 is a view for describing an electrostatic adsorbing process of a wafer before and during a plasma etching process in the substrate processing apparatus of FIG. 1.

FIG. 2 is a view for describing an electrostatic adsorbing process of wafer W before and during a plasma etching process in the substrate processing apparatus of FIG. 1. In the present exemplary embodiment, since both chamber 11 and upper electrode plate 29 are the ground potentials, upper electrode plate 29 may constitute a part of chamber 11, and is close to wafer W, the potential difference between wafer W and chamber 11 will be described to be represented by the potential difference between wafer W and upper electrode plate 29 hereinafter.

First, wafer W is placed on electrostatic chuck 23, while DC voltage from DC power source 24 is not applied to electrostatic electrode plate 22 in electrostatic chuck 23 of susceptor 12 and the potential of electrostatic electrode plate 22 is maintained at the ground potential, that is, 0 V. Herein, the potential of placed wafer W is the ground potential, that is, 0 V. Since the DC voltage is not applied to electrostatic electrode plate 22 and the potential of wafer W is also the ground potential, the potential of placing surface 23a of electrostatic chuck 23 is also the ground potential, that is, 0 V (FIG. 2A).

Subsequently, under the gas atmosphere in which the pressure in chamber 11 is several hundreds mTorr, plus DC voltage, for example, DC voltage of 2.5 kV is applied to electrostatic electrode plate 22 from DC power source 24 (FIG. 2B).

Subsequently, the plasma etching process is performed onto wafer W with plasma 36 by introducing the processing gas to the inner space of processing chamber 15 and exciting the introduced processing gas with the high frequency power to generate plasma 36. At this time, the electric charges between wafer W and upper electrode plate 29 freely move by the electrons or the cations in plasma 36. As a result, the potential of wafer W is maintained at the same ground potential as the potential of upper electrode plate 29 (0 V). During the plasma etching process, the DC voltage of 2.5 kV is applied to electrostatic electrode plate 22 and thus 2.5 kV is maintained as the potential of electrostatic electrode plate 22.

Herein, since the dielectric material of electrostatic chuck 23 has a high resistance, ideally, the electric charges do not move between placing surface 23a of electrostatic chuck 23 and electrostatic electrode plate 22. However, some of electric charges may move according to, for example, a continuous usage at a high temperature or a process condition. As a result, the potential difference of, for example, 2.0 kV is generated between electrostatic electrode plate 22 and placing surface 23a, and the potential of placing surface 23a becomes 0.5 kV. The potential difference of, for example, 0.5 kV is generated between placing surface 23a and wafer W according to the generation of the potential difference between electrostatic electrode plate 22 and placing surface 23a (FIG. 2C).

Thereafter, by the contact state of wafer W and placing surface 23a or the presence of the high resistance dielectric material in electrostatic chuck 23, the electric charges between placing surface 23a and wafer W and between electrostatic electrode plate 22 and placing surface 23a do not move, and thus, the potential differences between electrostatic electrode plate 22 and placing surface 23a and between placing surface 23a and wafer W are maintained.

Even after the plasma etching process is completed and plasma 36 is dissipated, since the potential differences between electrostatic electrode plate 22 and placing surface 23a and between placing surface 23a and wafer W are maintained, the potential of wafer W still remains at 0 V, the potential of electrostatic electrode plate 22 still remains at 2.5 kV, and the potential of placing surface 23a still remains at 0.5 kV. As a result, since the potential difference between wafer W and placing surface 23a becomes 0.5 kV and wafer W is electrostatically adsorbed on placing surface 23a by the Coulomb force due to the potential difference, wafer W cannot be easily removed from electrostatic chuck 23 after the plasma etching process.

In the present exemplary embodiment, in order to resolve the potential difference between wafer W and placing surface 23a after the plasma etching process, direct current discharge ("DC discharge") is used which is generated between wafer W and chamber 11 including upper electrode plate 29 to be described below.

Figure 3:
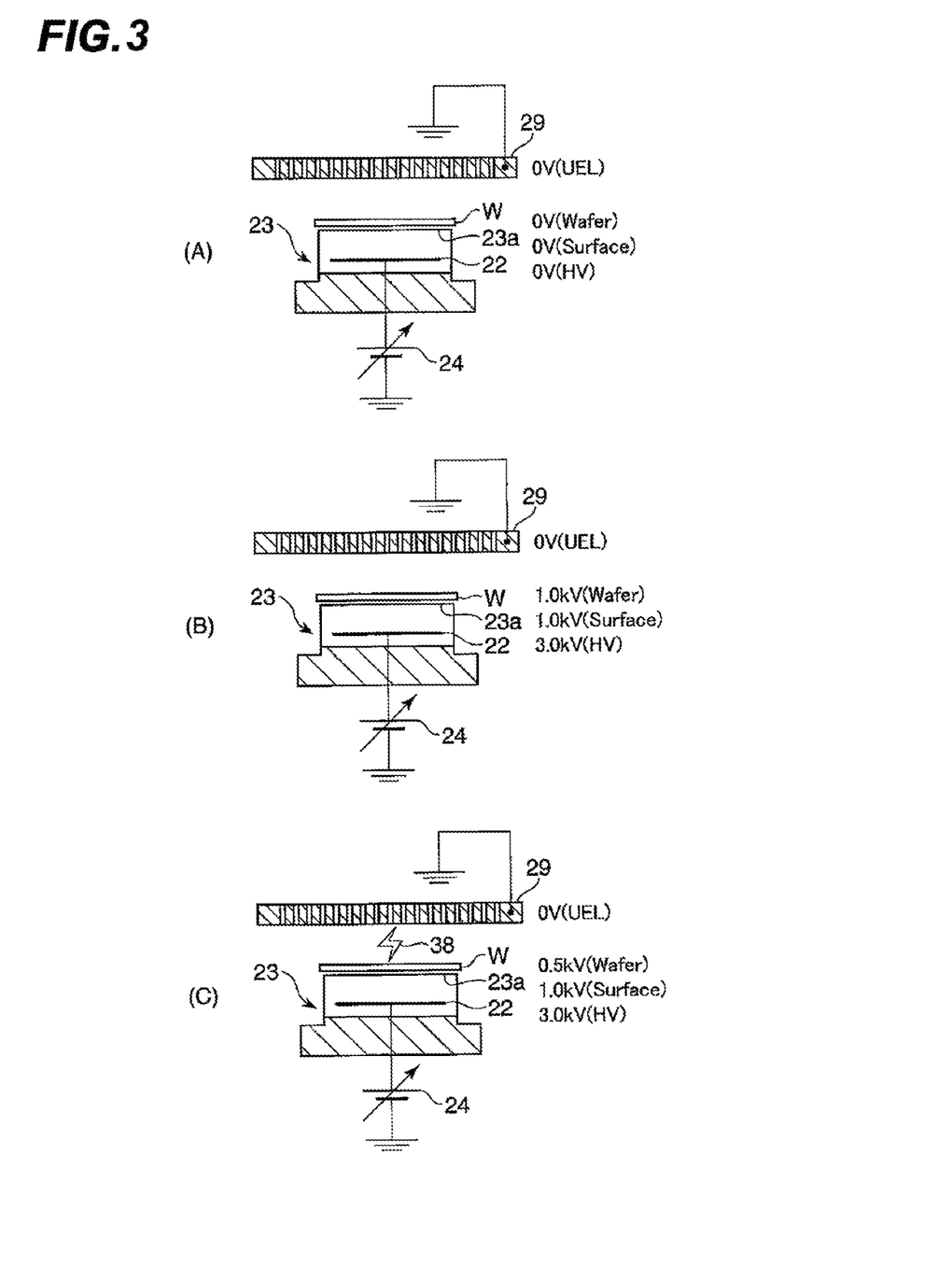
FIG. 3 is a view for describing a process by which DC discharge is generated between a wafer and an upper electrode plate.

FIG. 3 is a view for describing a process by which the DC discharge is generated between wafer W and upper electrode plate 29.

First, while DC voltage is not applied to electrostatic electrode plate 22 and the potential of electrostatic electrode plate 22 is maintained at 0 V, wafer W of which the potential is 0 V is placed on electrostatic chuck 23. In this case, similarly to the process of FIG. 2A, the potential of electrostatic electrode plate 22, the potential of placing surface 23a, and the potential of wafer W are 0 V (FIG. 3A).

Subsequently, the processing gas is introduced into processing chamber 15 of chamber 11 by depressurizing the inside of chamber 11, and a positive DC voltage, for example, DC voltage of 3.0 kV is applied to electrostatic electrode plate 22 from DC power source 24. Herein, as described above, since an absolute value of the potential difference between electrostatic electrode plate 22 and placing surface 23a is maintained at 2.0 kV, when the potential of electrostatic electrode plate 22 is changed from 0 V to 3.0 kV, the potential of placing surface 23a is also changed from 0 V to 1.0 kV. Since the potential difference between placing surface 23a and wafer W is maintained, the potential of wafer W is also changed from the ground potential to 1.0 kV (FIG. 3B). As a result, the absolute value of the potential difference between upper electrode plate 29 having the ground potential and wafer W is increased to become 1.0 kV.

Herein, when the absolute value of the potential difference between wafer W and upper electrode plate 29 is increased, DC discharge 38 is generated between wafer W and upper electrode plate 29 (FIG. 3C). When DC discharge 38 is generated, wafer W and upper electrode plate 29 are communicated with each other, and thus, the movement of the electric charges occurs between wafer W and upper electrode plate 29, such that the potential difference between wafer W and upper electrode plate 29 is decreased. At this time, when DC discharge 38 is generated, the potential difference between wafer W and upper electrode plate 29 is instantly decreased, and thus, the potential difference is reduced up to a potential difference in which the discharge cannot be maintained, such that the movement of the electric charges immediately stops. As a result, the potential difference between wafer W and upper electrode plate 29 is not completely resolved and a predetermined potential (hereinafter, referred to as a "remaining potential after DC discharge"), for example, the potential of 0.5 kV remains on wafer W.

With respect to the remaining potential after the DC discharge, since the potential difference between wafer W and upper electrode plate 29 is larger than the potential difference by which the DC discharge can be generated during the potential of wafer W changes from 1.0 kV up to the remaining potential after DC discharge (0.5 kV), the DC discharge may be maintained. Meanwhile, since the potential of upper electrode plate 29 therebetween is the ground potential, when the potential difference between wafer W and upper electrode plate 29 is larger than an absolute value of the remaining potential after DC discharge, the DC discharge may be generated. That is, the absolute value |A| of the remaining potential after DC discharge becomes a minimum value of the potential difference by which the DC discharge can be generated. In the present exemplary embodiment, a case where the absolute value of the remaining potential after DC discharge is set to 0.5 kV will be described below.

Figure 4:
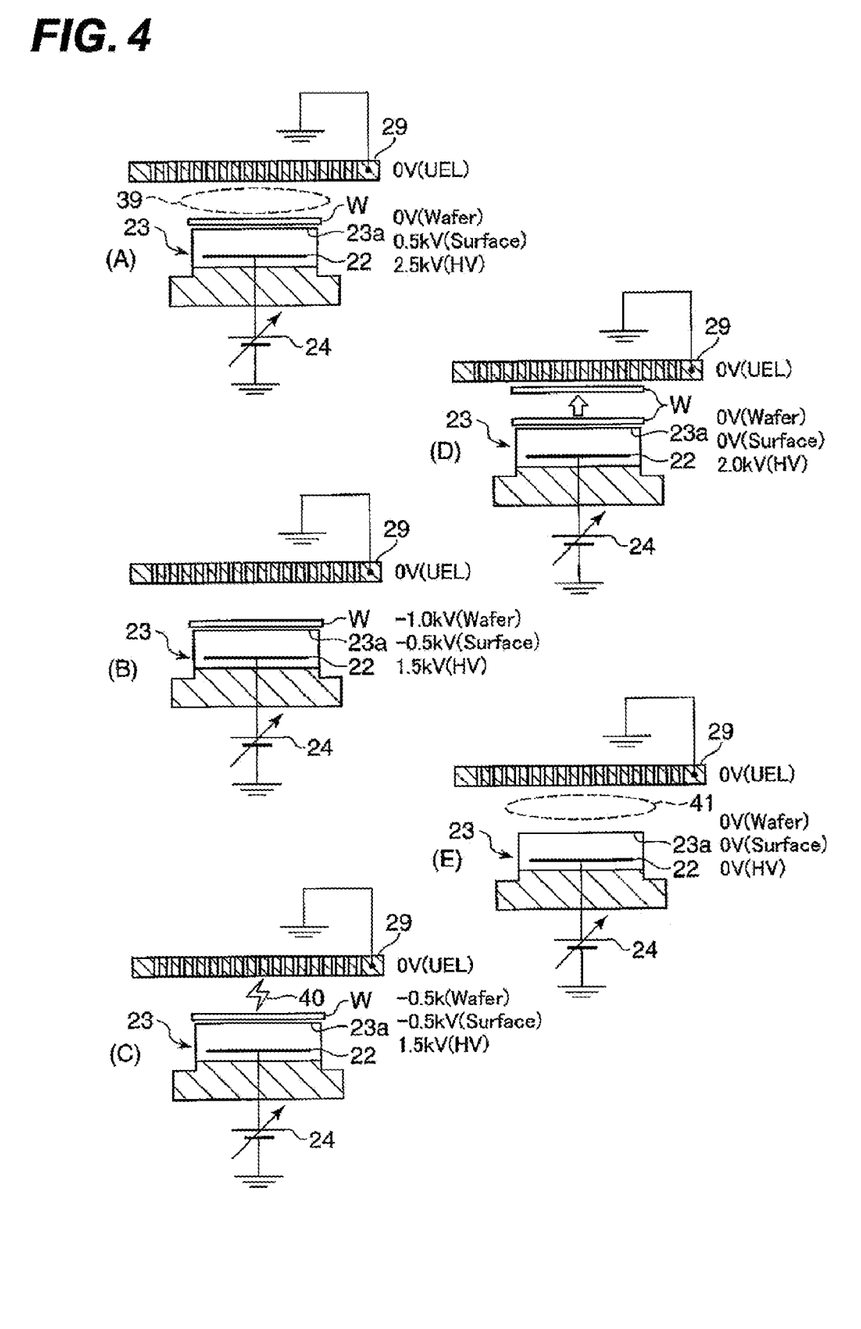
FIG. 4 is a view for describing a wafer removing process as the substrate removing method according to the exemplary embodiment of the present disclosure.

FIG. 4 is a view for describing a wafer removing process as the substrate removing method according to the exemplary embodiment of the present disclosure.

First, after the electrostatical adsorbing process of wafer W in FIG. 2, the plasma etching process ends, for example, by stop supplying the high frequency power for plasma generation to susceptor 12 in substrate processing apparatus 10 of FIG. 1. At this time, since the application of the voltage of 2.5 kV (predetermined potential) to electrostatic electrode plate 22 is maintained, the potential of 2.5 kV is maintained as the potential of electrostatic electrode plate 22 (potential maintaining step) and the potential of 0.5 kV is maintained as the potential of placing surface 23a. Meanwhile, the potential of wafer W is maintained at the same ground potential as the potential of upper electrode plate 29 (0 V) by plasma 39 generated during the plasma etching process (FIG. 4A).

Subsequently, while the processing gas exists in processing chamber 15 of chamber 11, the potential of the DC voltage applied to electrostatic electrode plate 22 is changed, and thus, the absolute value of the potential of placing surface 23a becomes 0.5 kV which is the absolute value of the remaining potential after the DC discharge, such that the polarity of the potential of placing surface 23a after the change and the polarity of the potential of wafer W become the same as each other, for example, a negative value. The potential of electrostatic electrode plate 22 is changed from 2.5 kV so that the absolute value of the potential difference between wafer W and upper electrode plate 29 becomes more than 0.5 kV which is the absolute value of the remaining potential after the DC discharge. Specifically, the potential of electrostatic electrode plate 22 is changed from 2.5 kV to 1.5 kV (potential changing step).

Even in this case, since the absolute value of the potential difference between electrostatic electrode plate 22 and placing surface 23a is also maintained at 2.0 kV as described above, when the potential of electrostatic electrode plate 22 is changed from 2.5 kV to 1.5 kV, the potential of placing surface 23a is also changed from 0.5 kV to −0.5 kV. Since the potential difference between placing surface 23a and wafer W is also maintained, the potential of wafer W is also changed from 0 V to −1.0 kV (FIG. 4B). As a result, since the absolute value of the potential difference between wafer W and upper electrode plate 29 having the ground potential is increased to become 1.0 kV and the absolute value of the potential difference between wafer W and upper electrode plate 29 exceeds the absolute value (0.5 kV) of the remaining potential after the DC discharge which is the minimum value of the potential difference by which the DC charge can be generated, DC discharge 40 is generated between wafer W and upper electrode plate 29 (FIG. 4C).

When DC discharge 40 is generated, since the absolute value of the potential difference between wafer W and upper electrode plate 29 becomes 0.5 kV which is the minimum value of the potential difference by which the DC charge can be generated, the potential of upper electrode plate 29 is 0 V, and the potential of wafer W before the generation of DC discharge 40 is −1.0 kV, such that the potential of wafer W after the generation of DC discharge 40 becomes −0.5 kV. As a result, the potentials of wafer W and placing surface 23a become the same potential (−0.5 kV).

Subsequently, the potential of the DC voltage applied to electrostatic electrode plate 22 is changed, and thus, the potential of electrostatic electrode plate 22 is changed from 1.5 kV to 2.0 kV. Even in this case, since the absolute value of the potential difference between electrostatic electrode plate 22 and placing surface 23a is also maintained at 2.0 kV, the potential of placing surface 23a is changed from −0.5 kV to 0 V. Since the potential difference between placing surface 23a and wafer W is maintained, the potential of wafer W is also changed from −0.5 kV to 0 V. Thereafter, wafer W is removed by lifting wafer W by, for example, pins (not shown) protruding from electrostatic chuck 23 and carrying out wafer W from processing chamber 15 by, for example, an arm (not shown) entering into processing chamber 15 (FIG. 4D) (removing step). When lifting wafer W by the pins, both the potentials of placing surface 23a and wafer W are 0 V and the potential difference between placing surface 23a and wafer W is 0 V, thereby easily lifting wafer W by the pins at placing surface 23a without generating the Coulomb force between wafer W and placed surface 23a.

Subsequently, the potential of electrostatic electrode plate 22 is changed from 2.0 kV to 0 V by changing the potential of the DC voltage applied to electrostatic electrode plate 22, and simultaneously, the processing gas is introduced to the inner space of processing chamber 15 to excite the introduced processing gas with the high frequency power for plasma generation to generate plasma 41. Even in this case, since the absolute value of the potential difference between electrostatic electrode plate 22 and placing surface 23a is maintained at 2.0 kV, the potential of placing surface 23a is changed from 0 V to −2.0 kV. Since wafer W is removed from placing surface 23a, placing surface 23a is exposed in processing chamber 15 to directly contact with plasma 41. As a result, the electric charges freely move between placing surface 23a and upper electrode plate 29 having the ground potential by the electrons or the cations in plasma 41, and thus, the electric charges are removed from placing surface 23a, such that the potential of placing surface 23a becomes the same ground potential as the potential of upper electrode plate 29 (FIG. 4E). Thereafter, the present process ends.

According to the wafer removing process of FIG. 4, after the plasma etching process, since the potential of electrostatic electrode plate 22 is changed from 2.5 kV to 1.5 kV and the absolute value of the potential difference between wafer W and upper electrode plate 29 becomes 1.0 kV exceeding 0.5 kV which is the minimum value of the potential difference by which the DC discharge can be generated as the remaining potential of the DC discharge, DC discharge 40 is generated between wafer W and upper electrode plate 29 and the absolute value of the potential of wafer W becomes 0.5 kV. The polarities of the potential of placing surface 23a and the potential of wafer W after the change are equally negative and the absolute value of the potential of placing surface 23a is also set to 0.5 kV which is the remaining potential after the DC discharge. Accordingly, the potentials of wafer W and placing surface 23a may be set to the same potential (−0.5 kV). As a result, wafer W is not electrostatically adsorbed at electrostatic chuck 23 and may be easily removed from electrostatic chuck 23.

In the aforementioned wafer removing process of FIG. 4, after wafer W is removed from placing surface 23a of electrostatic chuck 23, plasma 41 is generated between upper electrode plate 29 and placing surface 23a, such that the potential difference between upper electrode plate 29 and placing surface 23a may be resolved by the electrons or the cations in plasma 41 and the potential of placing surface 23a may be the ground potential. As a result, it is possible to prevent an abnormal discharge from being generated from placing surface 23a.

In the aforementioned wafer removing process of FIG. 4, the absolute value of the remaining potential after the DC discharge is 0.5 kV, but the absolute value of the remaining potential after the DC discharge is not limited to 0.5 kV and may be changed according to the pressure of chamber 11 or a kind of gas included in the processing gas. The absolute value of the potential difference between electrostatic electrode plate 22 and placing surface 23a is maintained at 2.0 kV, but the absolute value of the potential difference between electrostatic electrode plate 22 and placing surface 23a is not limited to 2.0 kV and may be changed according to a material or thickness of the dielectric material configuring electrostatic chuck 23.

As described above, the present disclosure has been described by using the exemplary embodiments, but the present disclosure is not limited to the exemplary embodiments.

The object of the present disclosure is also achieved by a storage medium storing a software program implementing a function of the aforementioned exemplary embodiment to, for example, a computer and by reading and executing the program stored in the storage medium by a CPU of the computer.

In this case, the program itself read from the storage medium implements the function of the aforementioned exemplary embodiment, such that the program and the storage medium storing the program configure the present disclosure.

Examples of the storage medium for storing the program may include a RAM, an NV-RAM, a floppy disk (registered trademark), a hard disk, an optical magnetic disk, an optical disk such as CD-ROM, CD-R, CD-RW, and DVD (DVD-ROM, DVD-RAM, DVD-RW, DVD+RW), a magnetic tape, a nonvolatile memory card, other ROMs, which can store a program. The program may be supplied to the computer by being downloaded from other computers or databases (not shown) which are connected through the Internet, a commercial network, or a local area network (LAN).

The function of the exemplary embodiments may be implemented by executing the program read by the CPU of the computer, and by performing a part of or the entire actual process by, for example, an operation system (OS) operating on the CPU based on the instruction of the program.

After the program read from the storage medium is stored in the memory installed on an extension board inserted in the computer or an extension unit connected to the computer, the CPU installed at the extension board or the extension unit performs a part of or the entire actual process based on the instruction of the program, and the function of the aforementioned exemplary embodiments may also be implemented by these processes.

The program may be formed in an object code, a program executed by an interpreter, and script data supplied to the OS.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate removing method comprising:
providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate;
maintaining a potential of the electrostatic electrode plate after the plasma process at a predetermined potential which is the same as the potential of the electrostatic electrode plate during the plasma process;
when an absolute value of a potential generated at the substrate is |A| after a DC discharge is generated between the substrate and the chamber, changing the potential of the electrostatic electrode plate from the predetermined potential to a first value such that the absolute value of the potential of a placing surface of the electrostatic chuck on which the substrate is placed becomes |A|, the polarity of the potential of the placing surface after the change and the polarity of the potential of the substrate become the same as each other, and the absolute value of the potential difference between the substrate and the chamber becomes |A| or more, thereby generating the DC discharge between the substrate and the chamber; and
removing the substrate from the electrostatic chuck in a state where the potential difference between the placing surface and the substrate is being eliminated substantially.

2. The substrate removing method of claim 1, further comprising:
after the removing process, generating plasma between the chamber and the electrostatic chuck at the same time when the potential of the electrostatic electrode plate is changed into a ground potential.

3. A non-transitory computer-readable storage medium storing a program that, when executed, causes a computer to perform a substrate removing method comprising:
providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate;
maintaining a potential of the electrostatic electrode plate after the plasma process at a predetermined potential which is the same as the potential of the electrostatic electrode plate during the plasma process;
when an absolute value of a potential generated at the substrate is |A| after a DC discharge is generated between the substrate and the chamber, changing the potential of the electrostatic electrode plate from the predetermined potential to a first value such that the absolute value of the potential of a placing surface of the electrostatic chuck on which the substrate is placed becomes |A|, the polarity of the potential of the placing surface after the change and the polarity of the potential of the substrate become the same as each other, and the absolute value of the potential difference between the substrate and the chamber becomes |A| or more, thereby generating the DC discharge between the substrate and the chamber; and
removing the substrate from the electrostatic chuck in a state where the potential difference between the placing surface and the substrate is being eliminated substantially.

4. A substrate removing method comprising:
providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate;
maintaining a potential of the electrostatic electrode plate after the plasma process at a predetermined potential which is the same as the potential of the electrostatic electrode plate during the plasma process;
when an absolute value of a potential generated at the substrate is |A| after a DC discharge is generated between the substrate and the chamber, changing the potential of the electrostatic electrode plate from the predetermined potential to a first value such that the absolute value of the potential of a placing surface of the electrostatic chuck on which the substrate is placed becomes |A|, the polarity of the potential of the placing surface after the change and the polarity of the potential of the substrate become the same as each other, and the absolute value of the potential difference between the substrate and the chamber becomes |A| or more, thereby generating the DC discharge between the substrate and the chamber;

changing the potential of the electrostatic electrode plate from the first value to a second value such that the potential of the placing surface and the potential of the substrate become zero; and removing the substrate from the electrostatic chuck in a state where the potential of the placing surface and the potential of the substrate are zero.

5. The substrate removing method of claim 4, wherein the predetermined value, the first value and the second value are 2.5 kV, 1.5 kV and 2.0 kV, respectively.

* * * * *